(12) United States Patent
Yonar et al.

(10) Patent No.: US 12,095,473 B2
(45) Date of Patent: Sep. 17, 2024

(54) TIME DOMAIN INTERLEAVING (71) Applicant: INTERNATIONAL BUSINESS MACHINES CORPORATION, Armonk, NY (US)

(72) Inventors: Abdullah Serdar Yonar, Zurich (CH); Pier Andrea Francese, Adliswil (CH); Marcel A. Kossel, Reichenburg (CH); Mridula Prathapan, Adliswil (CH); Matthias Braendli, Otelfingen (CH); Thomas Morf, Gross (CH)

(73) Assignee: International Business Machines Corporation, Armonk, NY (US)

(*) Notice: Subject to any disclaimer, the term of this patent is extended or adjusted under 35 U.S.C. 154(b) by 190 days.

(21) Appl. No.: 18/053,940

(22) Filed: Nov. 9, 2022

(65) Prior Publication Data

US 2024/0154620 A1    May 9, 2024

(51) Int. Cl.
*H03M 1/50* (2006.01)
*H03M 1/10* (2006.01)
*H03M 1/12* (2006.01)

(52) U.S. Cl.
CPC ............ *H03M 1/50* (2013.01); *H03M 1/1009* (2013.01); *H03M 1/1215* (2013.01); *H03M 1/1245* (2013.01)

(58) Field of Classification Search
CPC .... H03M 1/50; H03M 1/1245; H03M 1/1215; H03M 1/1009
See application file for complete search history.

(56) References Cited

U.S. PATENT DOCUMENTS 8,890,741 B2    11/2014    Dosho
9,577,684 B1     2/2017    Zur
2017/0357219 A1  12/2017   Chiu
(Continued)

OTHER PUBLICATIONS

Baert et al., "20.1 A 5GS/s 7.2 ENOB Time-Interleaved VCO-Based ADC Achieving 30.5fJ/conv-step," 2019 IEEE International Solid-State Circuits Conference—(ISSCC), 2019, Downloaded: Oct. 5, 2022, https://ieeexplore.ieee.org/stamp/stamp.jsp?tp=&arnumber=8662412, pp. 328-330.
(Continued)

*Primary Examiner* — Joseph J Lauture
(74) *Attorney, Agent, or Firm* — Stephen R. Yoder (57) ABSTRACT

The invention is notably directed to a voltage-to-time converter comprising a first interleaving stage configured to perform a sampling of an input voltage, thereby generating a first set of sampled voltage signals. The first interleaving stage is further configured to perform a first voltage-to-time conversion in an interleaved manner, thereby generating a first set of time-interleaved signals in the time domain. A second interleaving stage is configured to perform a time-to-voltage conversion of the first set of time-interleaved signals, thereby generating a second set of sampled voltage signals. The second interleaving stage is further configured perform a second voltage-to-time conversion in an interleaved manner, thereby generating a second set of time-interleaved signals in the time domain.
The invention further concerns a related design structure and a related method.

20 Claims, 6 Drawing Sheets

(56) References Cited

U.S. PATENT DOCUMENTS

2018/0267482 A1 9/2018 Wu
2018/0294818 A1* 10/2018 Galambos ........... H03M 1/1245

OTHER PUBLICATIONS

Chammas et al., A 12-GS/s 81-mW 5-bit Time-Interleaved Flash ADC With Background Timing Skew Calibration, IEEE Journal of Solid-State Circuits, vol. 46, No. 4, Apr. 2011, https://ieeexplore.ieee.org/stamp/stamp.jsp?tp=&arnumber=5723022, pp. 838-847.

Dudek et al., A High-Resolution CMOS Time-to-Digital Converter Utilizing a Vernier Delay Line, IEEE Transactions on Solid-State Circuits, vol. 35, No. 2, Feb. 2000, https://ieeexplore.ieee.org/stamp/stamp.jsp?tp=&amnumber=823449, pp. 240-247.

Elkholy et al., A 3.7 mW Low-Noise Wide-Bandwidth 4.5 GHz Digital Fractional-N PLL Using Time Amplifier-Based TDC, IEEE Journal of Solid-State Circuits, vol. 50, No. 4, Apr. 2015, https://ieeexplore.ieee.org/stamp/stamp.jsp?tp=&arnumber=7027236, pp. 867-881.

Huang et al., A CMOS 6-Bit 16-GS/s Time-Interleaved ADC Using Digital Background Calibration Techniques, IEEE Journal of Solid-State Circuits, vol. 46, No. 4, Apr. 2011, https://ieeexplore.ieee.org/stamp/stamp.jsp?tp=&arnumber-5728869, pp. 848-858.

Kim et al., "An 8bit, 2.6ps Two-Step TDC in 65nm CMOS Employing a Switched Ring-Oscillator Based Time Amplifier," 2015 IEEE Custom Integrated Circuits Conference (CICC), 2015, Nov. 30, 2015, https://ieeexplore.ieee.org/document/7338425, 6 pages.

Kull et al., "A 35 mW 8 b 8.8 GS/s SAR ADC with Low-Power Capacitive Reference Buffers in 32 nm Digital SOI CMOS," 2013 Symposium on VLSI Circuits Digest of Technical Papers, IEEE, Downloaded: Oct. 5, 2022, https://ieeexplore.ieee.org/stamp/stamp.jsp?tp=&arnumber=6578686, 2 pages.

Kull et al., "Implementation of Low-Power 6-8 b 30-90 GS/s Time-Interleaved ADCs With Optimized Input Bandwidth in 32 nm CMOS," IEEE Journal of Solid-State Circuits, vol. 51, No. 3, Mar. 2016, https://ieeexplore.ieee.org/stamp/stamp.jsp?tp=&amnumber=7409925, pp. 636-648.

Kull et al., A 10b 1.5GS/s Pipelined-SAR ADC with Background Second-Stage Common-Mode Regulation and Offset Calibration in 14nm CMOS FinFET, 2017 IEEE International Solid-State Circuits Conference, ISSCC 2017, Feb. 8, 2017, https://ieeexplore.ieee.org/stamp/stamp.jsp?tp=&arnumber=7870467, 3 pages.

Kwon et al., "A high-gain wide-input-range time amplifier with an open-loop architecture and a gain equal to current bias ratio," IEEE Asian Solid-State Circuits Conference, Nov. 14-16, 2011, https://ieeexplore.ieee.org/stamp/stamp.jsp?tp=&amnumber=6123579, pp. 325-328.

Lee et al., "A 1 GHz ADPLL With a 1.25 ps Minimum-Resolution Sub-Exponent TDC in 0.18 um Cmos," IEEE Journal of Solid-State Circuits, vol. 45, No. 12, Dec. 12, 2010, https://ieeexplore.ieee.org/stamp/stamp.jsp?tp=&arnumber=5609226, pp. 2874-2881.

Yu et al., "A 4-GS/s 39.9-dB SNDR 11.7-mW Hybrid Voltage-Time Two-Step ADC With Feed-Forward Ring Oscillator-Based TDCs," IEEE Solid-State Circuits Letters, vol. 2, No. 9, Sep. 2019, https://ieeexplore.ieee.org/stamp/stamp.jsp?tp=&arnumber=8758830, pp. 163-166.

Raisanen-Ruotsalainen et al., A Low Power CMOS Time-to-Digital Converter, IEEE Journal of Solid-State Circuits, vol. 30, No. 9, Sep. 9, 1995, https://ieeexplore.ieee.org/stamp/stamp.jsp?tp=&arnumber=406397, pp. 984-990.

Roberts et al., "A Brief Introduction to Time-to-Digital and Digital-to-Time Converters," IEEE Transactions on Circuits and Systems—II: Express Briefs, vol. 57, No. 3, Mar. 2010, https://ieeexplore.ieee.org/stamp/stamp.jsp?tp=&amnumber=5437390, pp. 153-157.

Zhang et al., "16.2 A 4× Interleaved 10GS/s 8b Time-Domain ADC with 16× Interpolation-Based Inter-Stage Gain Achieving >37.5dB SNDR at 18GHz Input," 2020 IEEE International Solid-State Circuits Conference—(ISSCC), 2020, Downloaded: Oct. 5, 2022, https://ieeexplore.ieee.org/stamp/stamp.jsp?tp=&arnumber=9062986, pp. 252-254.

Zhang et al., "An 8-Bit 10-GS/s 16× Interpolation-Based Time-Domain ADC With <1.5-ps Uncalibrated Quantization Steps," IEEE Journal of Solid-State Circuits, vol. 55, No. 12, Dec. 12, 2020, https://ieeexplore.ieee.org/document/9165099, pp. 3225-3235.

Zhu et al., "A Skew-Free 10 GS/s 6 bit CMOS ADC With Compact Time-Domain Signal Folding and Inherent Dem," IEEE Journal of Solid-State Circuits, vol. 51, No. 8, Aug. 8, 2016, https://ieeexplore.ieee.org/stamp/stamp.jsp?tp=&arnumber=7479488, pp. 1785-1796.

* cited by examiner

TIME DOMAIN INTERLEAVING

BACKGROUND

The present invention relates generally to the field of computing, and more particularly to voltage-to-time conversion.

The demand for the throughput in high-speed circuits such as high speed I/O links increases. This demand necessitates higher bandwidth efficiency which leads to the emergence of higher order modulation techniques such as 4 level Pulse Amplitude Modulation (PAM4) or Orthogonal Frequency Division Multiplexing (OFDM). As a result, wireline receivers have to be able to cope with complex modulation schemes while doing the equalization utilizing complex algorithms. This brings the need for analog-to-digital converters (ADCs), the outputs of which will be processed by Digital Signal Processors (DSPs). Furthermore, not only does the modulation complexity increase, but the baud rate increases as well to reach to the target data rates.

Single channel ADC conversion speeds are not sufficient to comply with the latest baud rate requirements. Thus, the majority of current I/O link architectures utilizes time interleaving. In time interleaving applications multiple ADCs work in parallel in a time interleaved manner while one ADC is converting the next one samples the next sample. This parallel operation enables higher speeds. Interleaving is also often required since the digital circuits processing the ADC outputs usually run at reduced clock speeds.

Time domain converters utilize time as a medium to process the input information. Such converters convert an input voltage to a proportional time quantity by a voltage-to-time converter (VTC). The time quantity is then converted to a digital representation by a time-to-digital converter (TDC).

Despite the advantages offered by scaling, achieving sub gate delay resolution to cut down the conversion times still poses one of the biggest challenges for the widespread use of time domain ADCs. Achieving sub-gate delay is also a key element to reach higher resolutions for a given sampling rate.

SUMMARY

According to an aspect, the invention is embodied as a VTC comprising a first interleaving stage configured to perform a sampling of an input voltage, thereby generating a first set of sampled voltage signals. The first interleaving stage is further configured to perform a first voltage-to-time conversion in an interleaved manner, thereby generating a first set of time-interleaved signals in the time domain. A second interleaving stage is configured to perform a time-to-voltage conversion of the first set of time-interleaved signals, thereby generating a second set of sampled voltage signals. The second interleaving stage is further configured to perform a second voltage-to-time conversion in an interleaved manner, thereby generating a second set of time-interleaved signals in the time domain.

According to another aspect a design structure is provided. The design structure is tangibly embodied in a machine readable medium for designing, manufacturing, or testing an integrated circuit. The design structure comprises a VTC comprising a first interleaving stage configured to perform a sampling of an input voltage, thereby generating a first set of sampled voltage signals. The first interleaving stage is further configured perform a first voltage-to-time conversion in an interleaved manner, thereby generating a first set of time-interleaved signals in the time domain. A second interleaving stage is configured to perform a time-to-voltage conversion of the first set of time-interleaved signals, thereby generating a second set of sampled voltage signals. The second interleaving stage is further configured perform a second voltage-to-time conversion in an interleaved manner, thereby generating a second set of time-interleaved signals in the time domain.

According to another aspect, a method for performing a voltage-to-time conversion is provided. The method comprises performing, by a first interleaving stage, a sampling of an input voltage, thereby generating a first set of sampled voltage signals. The method further comprises performing, by the first interleaving stage, a first voltage-to-time conversion in an interleaved manner, thereby generating a first set of time-interleaved signals in the time domain. The method further comprises performing, by a second interleaving stage, a time-to-voltage conversion of the first set of time-interleaved signals, thereby generating a second set of sampled voltage signals. The method further comprises performing, by the second interleaving stage, a second voltage-to-time conversion in an interleaved manner, thereby generating a second set of time-interleaved signals in the time domain.

Embodiments of the invention will be described in more detail below, by way of illustrative and non-limiting examples, with reference to the accompanying drawings.

DETAILED DESCRIPTION

In reference to FIGS. 1-7, some general aspects and terms of embodiments of the invention are described.

Embodiments of the invention provide a VTC with an interleaver comprising a first and a second interleaving stage. The interleaver establishes according to embodiments a hierarchical VTC that interleaves the edge timing information. According to embodiments, the edge timing information may be processed by simple logic gates.

According to embodiments, the interleaver converts the time back to the voltage domain at an intermediate stage and back to time using a different slope in the second interleaving stage to achieve time amplification as a built-in function of the interleaver. This may substantially relax the requirements of the following TDC.

According to embodiments, the interleaving is accomplished in the time domain and only the edge timing information is utilized. This facilitates architectures that can be designed with logic gates, current sources and current mirrors. Hence the complexity may be decreased considerably compared to a regular voltage domain interleaving architecture while the configurability and ease of calibration can be increased.

As the circuit architecture according to embodiments of the invention is digitally intensive, a compact and power efficient design may be achieved which may be integrated in the digital design flow. Furthermore, the calibration effort of embodiments of the invention may be low. More particularly, according to embodiments of the invention, two types of parameters can be easily configured, namely the sampling capacitances and the currents in the VTCs. Currents, especially, can be controlled externally, and the control circuit can be placed at the periphery of the circuit. Such an architecture may prevent the control circuit from interfering with the high speed part of the circuit. Furthermore, the high speed nature of the VTCs may allow the implementation of a lower interleaving factor in the first rank. This may reduce the clock skew problem in the interleaved systems.

Figure 1:
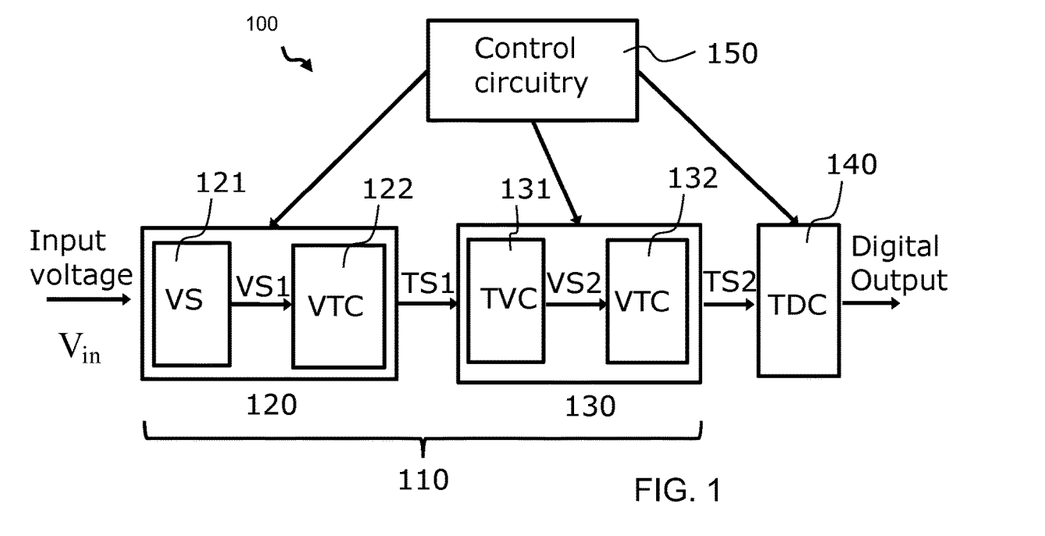
FIG. 1 is a simplified schematic block diagram of an ADC comprising a VTC according to an embodiment of the invention.

FIG. 1 is a simplified schematic block diagram of an ADC 100 comprising a VTC 110 according to an embodiment of the invention. The VTC 110 comprises a first interleaving stage 120. The first interleaving stage 120 comprises one or more voltage sampling units (VS) 121 configured to perform a sampling of an input voltage $V_{in}$. This generates a first set of sampled voltage signals VS1. The first interleaving stage 120 further comprises a plurality of first VTCs 122 configured to perform a first voltage-to-time conversion in an interleaved manner, thereby generating a first set of time-interleaved signals TS1 in the time domain.

The ADC 100 further comprises a second interleaving stage 130 comprising a plurality of time-to-voltage converters (TVCs) 131. The TVCs 131 are configured to perform a time-to-voltage conversion of the first set of time-interleaved signals TS1, thereby generating a second set of sampled voltage signals VS2. The second interleaving stage 130 further comprises a plurality of second VTCs (VTC) 132 configured to perform a second voltage-to-time conversion in an interleaved manner, thereby generating a second set of time-interleaved signals TS2 in the time domain.

It should be noted that for ease of illustration FIG. 1 shows only one of the plurality of components that may be allocated to the first interleaving stage and the second interleaving stage. The first interleaving stage 120 and the second interleaving stage 130 may each comprise a plurality of these components as mentioned above, e.g. a plurality of TVCs and VTCs. Furthermore, the second interleaving stage 130 may encompass a plurality of separate interleaving stages or sub-stages.

The ADC 100 further comprises a TDC 140. The TDC 140 is configured to convert the second set of time interleaved signals TS2 into the digital domain.

In addition, the ADC 100 comprises a control circuit 150 for controlling the ADC 100. The control circuit 150 may be in particular configured to control the operation of the first interleaving stage 120 and the second interleaving stage 130, in particular the currents of constant current sources of the first interleaving stage 120 and the second interleaving stage 130.

According to embodiments, the control circuit may be arranged at a peripheral part of the VTC 110, Such an arrangement may reduce interferences with the first interleaving stage 120 and the second interleaving stage 130.

Figure 2A:
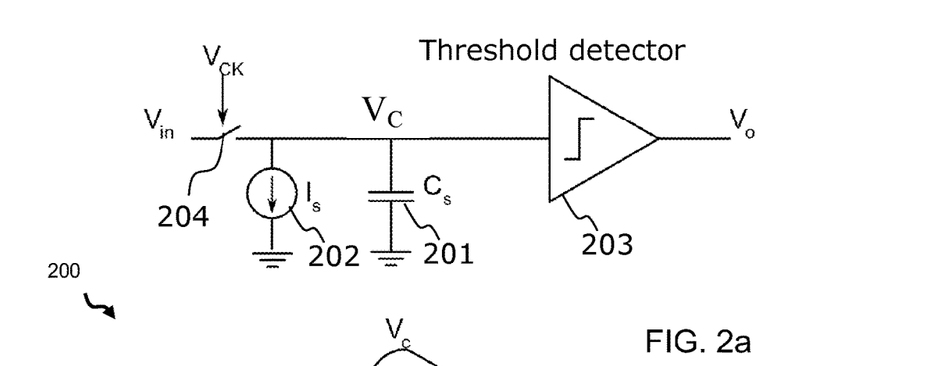
FIG. 2a shows an embodiment of a VTC according to an embodiment of the invention.
Figure 2B:
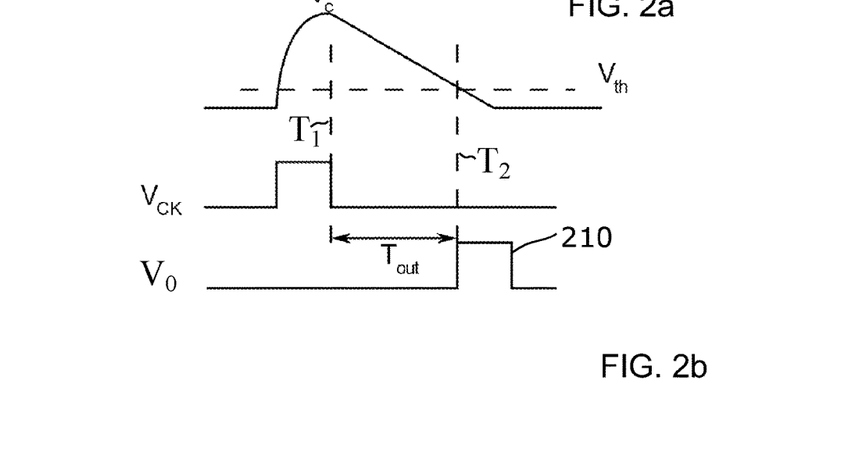
FIG. 2b shows a corresponding timing diagram of a corresponding clock signal and an output signal of the VTC.

FIG. 2a shows an embodiment of a VTC 200 according to an embodiment of the invention. FIG. 2b shows a corresponding timing diagram of a corresponding clock signal and an output signal.

Referring at first to FIG. 2a, the VTC 200 comprises a sampling capacitor 201, $C_S$ and a constant current source 202 which provides a constant current $I_S$. The VTC 200 further comprises a threshold detector 203 and a switch 204. Accordingly, the VTC 200 is embodied as a voltage ramp based VTC. The VTC 200 is configured to sample an input voltage $V_{in}$ on the sampling capacitor 201 by means of the switch 204. The switch 204 is triggered by a voltage clock signal $V_{CK}$. The sampled input voltage on Vs is then discharged through the constant current source 202. This operation leads to a constant slope voltage ramp as shown in FIG. 2b. Whenever the voltage ramp decreases below a predefined threshold $V_{th}$, an event is triggered, e.g. a pulse 210 as shown in FIG. 2b. The time difference $T_{out}$ between the ramp start point $T_1$ and the triggered event is the output time quantity $T_{out}$ which is equivalent to the sampled signal in the voltage domain.

Figure 3:
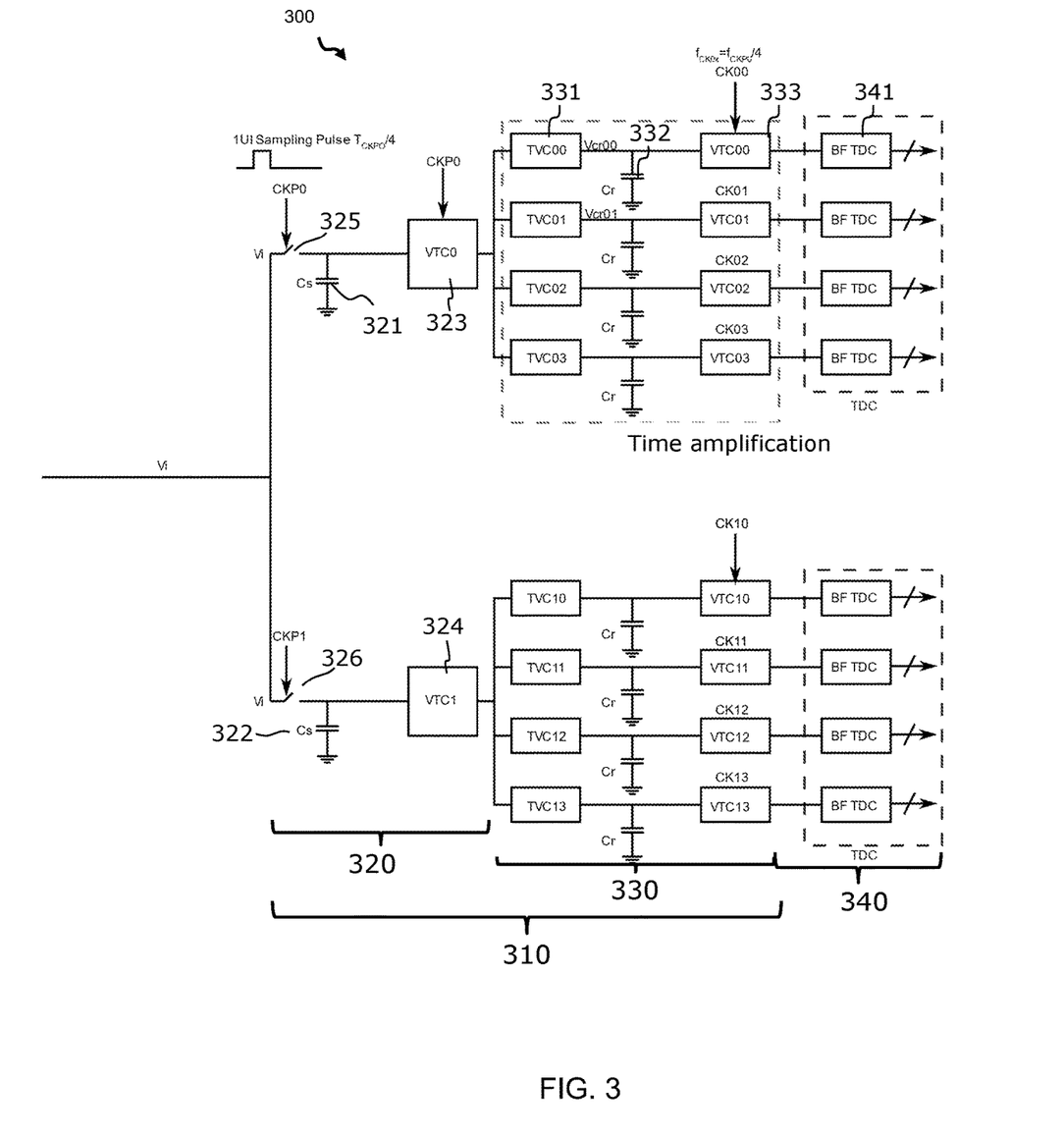
FIG. 3 is a more detailed schematic block diagram of an ADC according to an embodiment of the invention.

FIG. 3 is a more detailed schematic block diagram of an ADC 300 according to an embodiment of the invention. More particularly, it shows a half of a conceptual 16 times interleaved architecture, more particularly a "positive half" or a "negative half" of a differential architecture. The ADC 300 comprises a VTC 310 which comprises a first interleaving stage 320 and a second interleaving stage 330.

The first interleaving stage 320 comprises two sampling units each comprising a switch and a sampling capacitor $C_S$. More particularly, a first sampling unit comprises a sampling capacitor 321 and a sampling switch 325 and a second sampling unit comprises a sampling capacitor 322 and a sampling switch 326. The first interleaving stage 320 further comprises two VTCs 323 and 324 configured to perform a first voltage-to-time conversion in an interleaved manner.

In operation, the input voltage Vi is sampled on the sampling capacitances Cs at a first sampling frequency $f_{CKP0}$, which may also be denoted as first rank clock frequency. The respective signals are denoted in FIG. 3 as clock signals CKP0, CKP1. The first rank clock frequency may be e.g. 20 GHz. The sampling capacitances Cs of the first interleaving stage may be commonly denoted as a first set of capacitors.

Then this sampled voltage information is converted to the time domain by the VTCs 323 and 324.

The second interleaving stage 330 comprises a set of TVCs TVC00, TVC01, TVC02 and TVC03 and a set of TVCs TVC10, TVC11, TVC12 and TVC13, commonly denoted as 331, each followed by a respective capacitor Cr, 332 of a set of capacitors.

The second interleaving stage 330 further comprises a set of VTCs VTC00, VTC01, VTC02 and VTC03 and a set of VTCs VTC10, VTC11, VTC12 and VTC13, commonly denoted as 333.

The time domain information provided by the VTC 323 is hence interleaved four times and the respective voltage signals are converted back to voltage at each node by the set of TVCs TVC00, TVC01, TVC02 and TVC03 and by the set of TVCs TVC10, TVC11, TVC12 and TVC13.

The output voltages of the TVCs TVC00, TVC01, TVC02, TVC03 TVC10, TVC11, TVC12 and TVC13 are then converted to the time domain by the VTCs VTC00, VTC01, VTC02, VTC03, VTC10, VTC11, VTC12 and VTC13 respectively.

The VTCs VTC00, VTC01, VTC02, VTC03, VTC10, VTC11, VTC12 and VTC13 of the second interleaving stage 330 run at a second sampling frequency which may also be denoted as second stage clock frequency or second rank clock frequency having a frequency $f_{CKP0}/4$. Assuming as mentioned above that the first rank clock frequency is 20 GHz, the second rank clock frequency would be 5 GHz according to this example. The clock signals which are applied to the VTCs VTC00, VTC01, VTC02, VTC03 are denoted as CK0x and the clock signals which are applied to the VTCs VTC10, VTC11, VTC12 and VTC13 are denoted as CK1x.

In general, the first sampling frequency is x-times higher than the second sampling frequency, wherein x is an integer and corresponds to the interleaving factor of the second interleaving stage.

Furthermore, the VTCs VTC00, VTC01, VTC02, VTC03, VTC10, VTC11, VTC12 and VTC13 of the second interleaving stage 330 use a different slope than the VTCs VTC0 and VTC1 of the first interleaving stage 320.

This allows time amplification. Then the amplified time information is digitalized by TDCs 341, BF TDC of a TDC 340. This finalizes the analog-to-digital conversion process.

Figure 4:
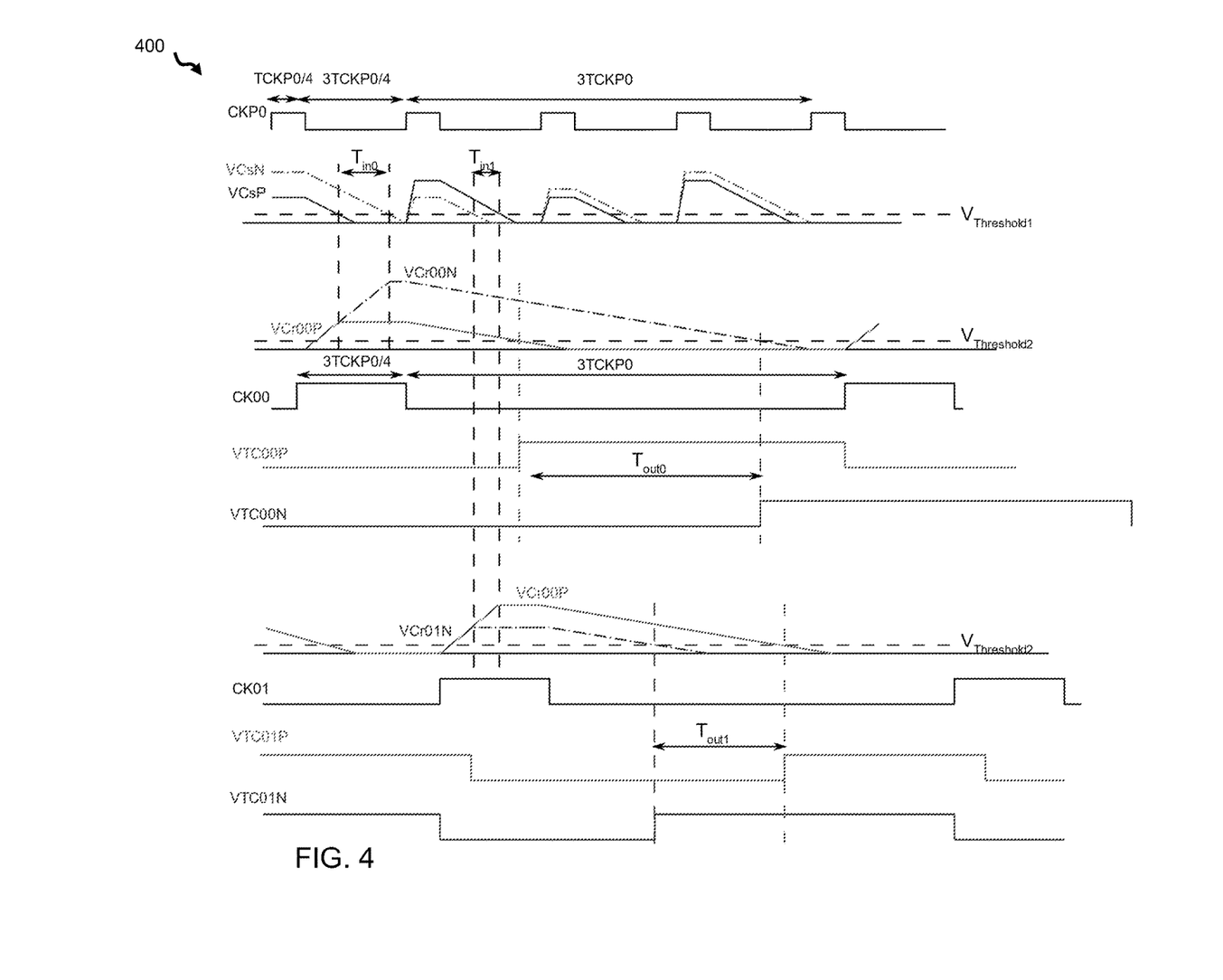
FIG. 4 shows exemplary waveforms of signals of the ADC of FIG. 3.

FIG. 4 shows exemplary waveforms of the differential architecture as described above with reference to FIG. 3.

CKP0 denotes the clock signal which is applied to the switch 325 of the first interleaving stage 320.

The input signal Vi is sampled when the clock signal CKP0 is high on the capacitors CsP and CsN (differentially) which is illustrated as VCsN and VCsP. CsP is the sampling capacitor of a respective positive branch of the differential architecture and CsN is the sampling capacitor of the respective negative branch of the differential architecture corresponding to the capacitors Cs, 321 as shown in FIG. 3.

Both signals are ramped down while the voltages VCr0xN and VCr0xP on the capacitors CrN and CrP respectively are being ramped up. CsP is the capacitor of the respective positive branch of the differential architecture and CsN is the capacitor of the respective negative branch of the differential architecture, corresponding to the capacitors 332 as shown in FIG. 3.

The voltage ramp up is stopped when the first stage ramp (VCsN and VCsP) reached down to a threshold value $V_{Threshold1}$ (indicated with a dashed line). The time period from the start of charge to the crossing of the first threshold corresponds to an input time $T_{in0}$.

Hence, at the end of this step, a differential voltage is accumulated between VCr0xN and VCr0xP.

As described above, the second interleaving stage is controlled by a second sampling frequency or in other words a second stage clock signal, e.g. a 5 GHz clock denoted as CK00 in this example. Both VCr0xN and VCr0xP start to ramp down with a small slope compared to the first rank ramp slope when CK0x becomes low.

Whenever VCr0xN and VCr0xP cross the second threshold value $V_{Threshold2}$, a pulse is generated which is illustrated in this example with VTC00P and VTC00N as well as VTC01P and VTC01N.

The time difference between these two pulses gives the amplified and interleaved time domain information of the input signal, namely $T_{out0}$ and $T_{out1}$.

Figure 5:
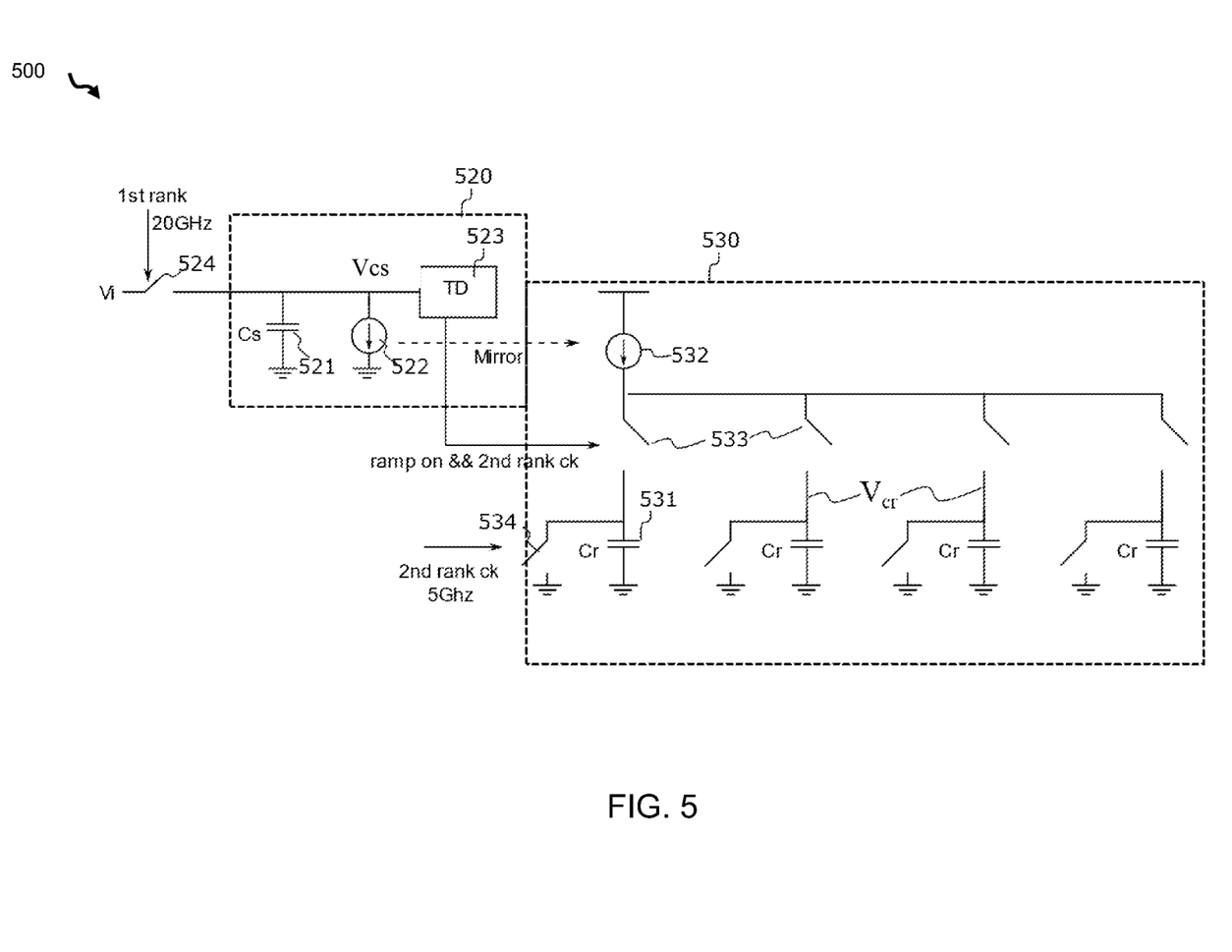
FIG. 5 shows a circuit diagram of a two-stage or in other words two-rank VTC according to an embodiment of the invention.

FIG. 5 shows a circuit diagram of a two-stage or in other words two-rank VTC 500 according to an embodiment of the invention.

The VTC 500 comprises a first interleaving stage 520 and a second interleaving stage 530. The first interleaving stage 520 comprises a sampling capacitor Cs, 521 which may be part of a first set of capacitors of the first interleaving stage 520, a constant current source 522 which may be part of a first set of constant current sources and a threshold detector 523 which may be part of a first set of threshold detectors and a switch 524.

The second interleaving stage 530 comprises a plurality of capacitors 531, Cr which may be part of a second set of capacitors of the second interleaving stage 530 and a constant current source 532 which may be part of a second set of constant current sources. The constant current of the constant current source 522 is mirrored as constant current to the constant current source 532. The second interleaving stage 530 furthermore comprises a plurality of switches 533 between the constant current source 532 and the plurality of capacitors 531, Cr and a plurality of switches 534 arranged in parallel to the plurality of capacitors 531, Cr.

In operation, the input voltage Vi is first sampled on the sampling capacitor 521, Cs at a first sampling frequency, which may also be denoted as the frequency of the first rank clock. The first sampling frequency may be e.g. 20 GHz. Then the sampling capacitor 521, Cs is discharged by the constant current source 522 with a configurable current to achieve a voltage ramp. The output voltage $V_{CS}$ on the sampling capacitor 521, Cs is observed by the threshold detector 523, TD which controls the current steering in the second stage.

The constant current source 532 in the second stage injects the mirrored current to the corresponding capacitor 531, Cr while the voltage on the capacitor 521, Cs is ramped down. Whenever the voltage $V_{CS}$ on the sampling capacitor 521 decreases below the threshold, the current injection to the respective capacitor 531, Cr stops. Thus, a voltage $V_{Cr}$ proportional to the input is developed on the respective capacitor 531, Cr.

Then the voltage $V_{Cr}$ is ramped down dictated by a second sampling frequency which may also be denoted as the second rank clock. This is done with a different slope in order to achieve time amplification.

The time period from the start of discharge to the crossing of the second threshold is the output time.

Figure 6:
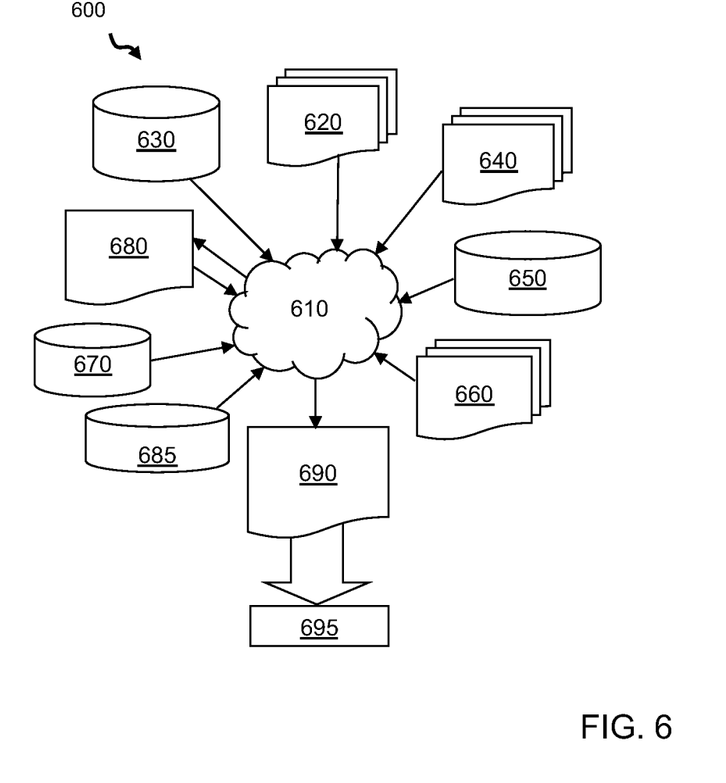
FIG. 6 shows a block diagram of an exemplary design flow.

FIG. 6 shows a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above and shown e.g. in FIGS. 1-5. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA).

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown in FIGS. 1-5. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown in FIGS. 1-5 to generate a Netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 610 may include hardware and software modules for processing a variety of input data structure types including Netlist 680. Such data structure types may reside, for example, within library elements 630 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-5. In one embodiment, design structure 690 may comprise a compiled, executable HDL simulation model that functionally simulates the devices shown in FIGS. 1-5.

Design structure 690 may also employ a data format used for the exchange of layout data of integrated circuits and/or symbolic data format (e.g. information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-5. Design structure 690 may then proceed to a stage 695 where, for example, design structure 690: proceeds to tape-out, is released to manufacturing, is released to a mask house, is sent to another design house, is sent back to the customer, etc.

Figure 7:
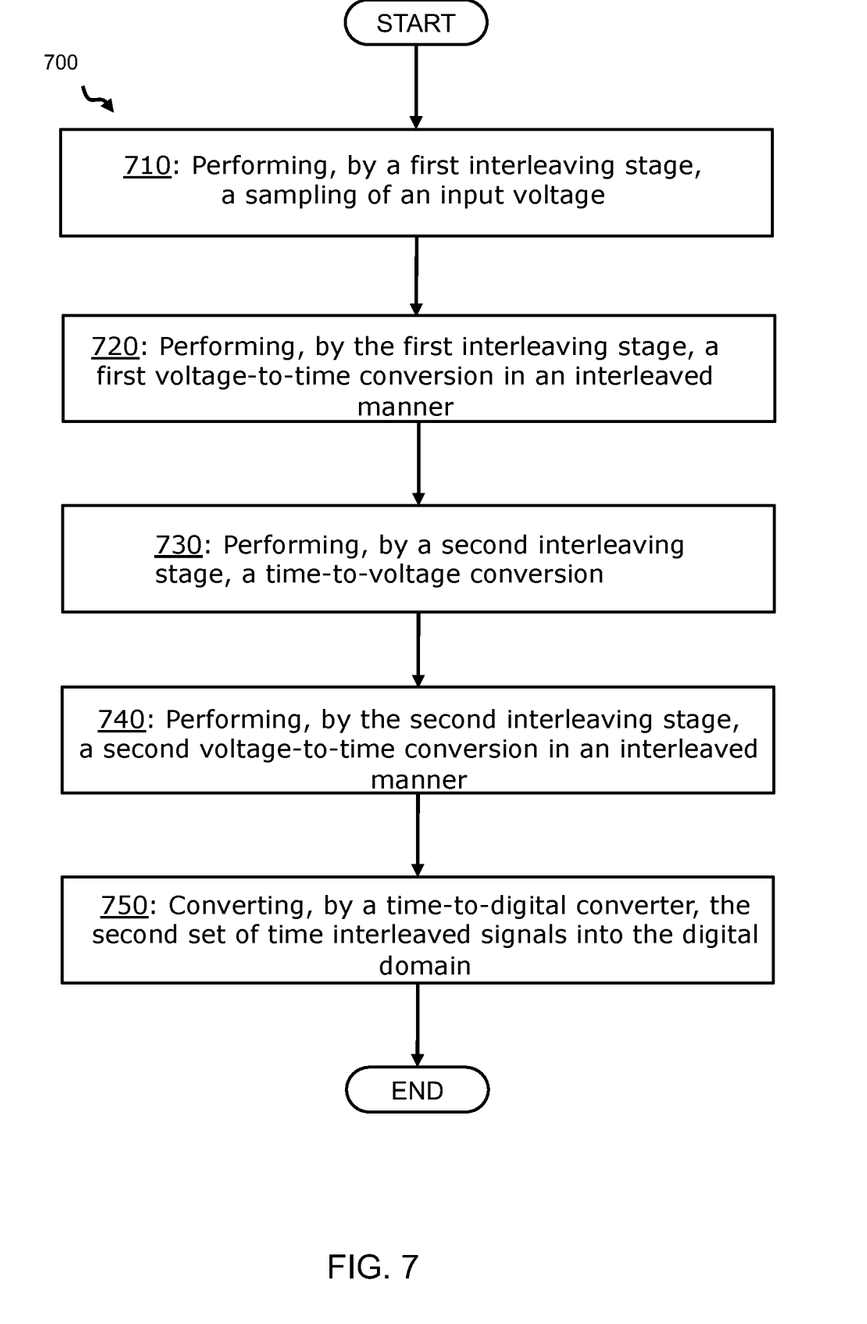
FIG. 7 shows a flow chart of method steps of a method for performing a voltage-to-time conversion according to an embodiment of the invention.

FIG. 7 shows a flow chart of method steps of a method for performing a voltage-to-time conversion according to an embodiment of the invention.

The method may be performed e.g. by means of devices according to embodiments of the invention, e.g. by the devices 100, 200, 300 and/or 500 as shown in FIGS. 1, 2, 3 and 5.

The method starts at a step 710. At the step 710, the method comprises a step of performing, by a first interleaving stage, a sampling of an input voltage, thereby generating a first set of sampled voltage signals.

At a step 720, the method comprises a step of performing, by the first interleaving stage, a first voltage-to-time conversion in an interleaved manner, thereby generating a first set of time-interleaved signals in the time domain.

At a step 730, the method comprises a step of performing, by a second interleaving stage, a time-to-voltage conversion of the first set of time-interleaved signals, thereby generating a second set of sampled voltage signals.

At a step 740, the method comprises a step of performing, by the second interleaving stage, a second voltage-to-time conversion in an interleaved manner, thereby generating a second set of time-interleaved signals in the time domain.

At a step 750, the method comprises a step of converting, by a TDC, the second set of time interleaved signals into the digital domain.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In general, modifications described for one embodiment may be applied to another embodiment as appropriate.

What is claimed is:

1. A voltage-to-time converter comprising
a first interleaving stage configured to:
perform a sampling of an input voltage, thereby generating a first set of sampled voltage signals; and
perform a first voltage-to-time conversion in an interleaved manner, thereby generating a first set of time-interleaved signals in the time domain; and
a second interleaving stage configured to:
perform a time-to-voltage conversion of the first set of time-interleaved signals, thereby generating a second set of sampled voltage signals; and
perform a second voltage-to-time conversion in an interleaved manner, thereby generating a second set of time-interleaved signals in the time domain.

2. A voltage-to-time converter according to claim 1, wherein the second interleaving stage is configured to perform a time amplification.

3. A voltage-to-time converter according to claim 2, the voltage-to-time converter being configured to perform the time amplification by:
performing the first voltage-to-time conversion with a first slope; and
performing the second voltage-to-time conversion with a second slope, wherein the second slope is smaller than the first slope.

4. A voltage-to-time converter according to claim 1, the voltage-to-time converter being configured to:
perform the first voltage-to-time conversion by discharging the first set of sampled voltage signals via a first set of constant current sources of a first constant current; and
perform the second voltage-to-time conversion by discharging the second set of sampled voltage signals via a second set of constant current sources of a second constant current, wherein the second constant current is lower than the first constant current.

5. A voltage-to-time converter according to claim 4, wherein:
the first interleaving stage comprises a first set of capacitors, the first set of constant current sources and a first set of threshold detectors;
the second interleaving stage comprises a second set of capacitors, the second set of constant current sources and a second set of threshold detectors;
the first interleaving stage is configured to perform the first voltage-to-time conversion by discharging the first set of sampled voltages on the first set of capacitors through the first set of constant current sources and by detecting a first predefined threshold value; and
the second interleaving stage is configured to perform the second voltage-to-time conversion by discharging the second set of sampled voltages on the second set of capacitors through the second set of constant current sources and by detecting a second predefined threshold value.

6. A voltage-to-time converter according to claim 4, further comprising a control circuit for controlling the currents of the first and the second set of constant current sources, wherein the control circuit is arranged at a peripheral part of the voltage-to-time converter to reduce interference with the first interleaving stage and the second interleaving stage.

7. A voltage-to-time converter according to claim 1, wherein the first interleaving stage is configured to operate at a first sampling frequency and the second interleaving stage is configured to operate at a second sampling frequency, wherein the second sampling frequency is smaller than the first frequency.

8. A voltage-to-time converter according to claim 7, wherein the first sampling frequency is x-times higher than the second sampling frequency, wherein x corresponds to the interleaving factor of the second interleaving stage.

9. An analog-to-digital converter, comprising a voltage-to-time converter according to claim 1 and a time-to-digital converter, the time-to-digital converter being configured to convert the second set of time interleaved signals into the digital domain.

10. A method for performing a voltage-to-time conversion, the method comprising:
performing, by a first interleaving stage, a sampling of an input voltage, thereby generating a first set of sampled voltage signals;
performing, by the first interleaving stage, a first voltage-to-time conversion in an interleaved manner, thereby generating a first set of time-interleaved signals in the time domain;
performing, by a second interleaving stage, a time-to-voltage conversion of the first set of time-interleaved signals, thereby generating a second set of sampled voltage signals; and
performing, by the second interleaving stage, a second voltage-to-time conversion in an interleaved manner, thereby generating a second set of time-interleaved signals in the time domain.

11. A method according to claim 10, further comprising:
converting, by a time-to-digital converter, the second set of time interleaved signals into the digital domain.

12. A method according to claim 10, further comprising performing, by the second interleaving stage, a time amplification.

13. A method according to claim 12, further comprising performing the time amplification by:

performing the first voltage-to-time conversion with a first slope; and performing the second voltage-to-time conversion with a second slope, wherein the second slope is smaller than the first slope.

14. A method according to claim 10, further comprising:

performing the first voltage-to-time conversion by discharging the first set of sampled voltage signals via a set of first constant current sources of a first constant current; and performing the second voltage-to-time conversion by discharging the second set of sampled voltage signals via a set of second constant current sources of a second constant current; wherein the second constant current is lower than the first constant current.

15. A design structure tangibly embodied in a machine-readable medium for designing, manufacturing, or testing an integrated circuit, the design structure comprising a Voltage-to-Time Converter comprising:

a first interleaving stage configured to:
 perform a sampling of an input voltage, thereby generating a first set of sampled voltage signals; and
 perform a first voltage-to-time conversion in an interleaved manner, thereby generating a first set of time-interleaved signals in the time domain; and a second interleaving stage configured to:
 perform a time-to-voltage conversion of the first set of time-interleaved signals, thereby generating a second set of sampled voltage signals; and
 perform a second voltage-to-time conversion in an interleaved manner, thereby generating a second set of time-interleaved signals in the time domain.

16. The structure of claim 15, wherein the second interleaving stage is configured to perform a time amplification.

17. The structure of claim 16, the voltage-to-time converter being configured to perform the time amplification by:

performing the first voltage-to-time conversion with a first slope; and performing the second voltage-to-time conversion with a second slope, wherein the second slope is smaller than the first slope.

18. The structure of claim 15, the voltage-to-time converter being configured to:

perform the first voltage-to-time conversion by discharging the first set of sampled voltage signals via a first set of constant current sources of a first constant current; and perform the second voltage-to-time conversion by discharging the second set of sampled voltage signals via a second set of constant current sources of a second constant current, wherein the second constant current is lower than the first constant current.

19. The structure of claim 18, wherein the first interleaving stage comprises a first set of capacitors, the first set of constant current sources and a first set of threshold detectors;

the second interleaving stage comprises a second set of capacitors, the second set of constant current sources and a second set of threshold detectors;

the first interleaving stage is configured to perform the first voltage-to-time conversion by discharging the first set of sampled voltages on the first set of capacitors through the first set of constant current sources and by detecting a first predefined threshold value; and the second interleaving stage is configured to perform the second voltage-to-time conversion by discharging the second set of sampled voltages on the second set of capacitors through the second set of constant current sources and by detecting a second predefined threshold value.

20. The structure of claim 15, wherein the first interleaving stage is configured to operate at a first sampling frequency and the second interleaving stage is configured to operate at a second sampling frequency, wherein the second sampling frequency is smaller than the first frequency.

* * * * *